(12) United States Patent
Pitts et al.

(10) Patent No.: US 11,837,681 B2
(45) Date of Patent: Dec. 5, 2023

(54) METHOD OF FABRICATING AN AVALANCHE PHOTODIODE EMPLOYING SINGLE DIFFUSION

(71) Applicant: NATIONAL RESEARCH COUNCIL OF CANADA, Ottawa (CA)

(72) Inventors: Oliver Pitts, Ottawa (CA); Omid Salehzadeh Einabad, Ottawa (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 255 days.

(21) Appl. No.: 17/414,420

(22) PCT Filed: Dec. 9, 2019

(86) PCT No.: PCT/CA2019/051764
§ 371 (c)(1),
(2) Date: Jun. 16, 2021

(87) PCT Pub. No.: WO2020/124205
PCT Pub. Date: Jun. 25, 2020

(65) Prior Publication Data
US 2022/0093815 A1    Mar. 24, 2022

Related U.S. Application Data

(60) Provisional application No. 62/781,721, filed on Dec. 19, 2018.

(51) Int. Cl.
*H01L 31/18* (2006.01)
*H01L 31/0304* (2006.01)
(Continued)

(52) U.S. Cl.
CPC .... *H01L 31/1844* (2013.01); *H01L 31/03042* (2013.01); *H01L 31/03046* (2013.01);
(Continued)

(58) Field of Classification Search
None
See application file for complete search history.

(56) References Cited

U.S. PATENT DOCUMENTS

| | | |
|---|---|---|
| 4,857,982 A | 8/1989 | Forrest |
| 6,015,721 A | 1/2000 | Kim |

(Continued)

FOREIGN PATENT DOCUMENTS

| | | |
|---|---|---|
| CN | 103227231 A | 7/2013 |
| JP | H0547692 A | 2/1993 |

(Continued)

OTHER PUBLICATIONS

Supplementary European Search Report dated Aug. 30, 2022 issued in corresponding EP Application No. 19901332.7.

(Continued)

*Primary Examiner* — Evren Seven
(74) *Attorney, Agent, or Firm* — Aird & McBurney LP (57) ABSTRACT

An avalanche photodiode with a diffused junction and the method for its fabrication are disclosed. The method comprising forming, on a substrate, a first high-doped region and a low-doped region; performing selective area growth (SAG) with in-situ etchant on the low-doped region to grow a SAG structure; and diffusing through the SAG structure to form a second high-doped region in the low-doped region.

19 Claims, 4 Drawing Sheets

(51) Int. Cl.
*H01L 31/0352* (2006.01)
*H01L 31/107* (2006.01)

(52) U.S. Cl.
CPC .. *H01L 31/035272* (2013.01); *H01L 31/1075* (2013.01); *H01L 31/1864* (2013.01)

(56) References Cited

U.S. PATENT DOCUMENTS

| | | | |
|---|---|---|---|
| 6,335,261 B1* | 1/2002 | Natzle | C23C 16/045 |
| | | | 438/758 |
| 6,359,322 B1 | 3/2002 | Haralson et al. | |
| 6,515,315 B1 | 2/2003 | Itzler et al. | |
| 6,730,979 B2 | 5/2004 | Boisvert | |
| 7,834,379 B2 | 11/2010 | Pan et al. | |
| 2004/0171238 A1* | 9/2004 | Arena | H01L 29/7834 |
| | | | 257/E29.267 |
| 2007/0015333 A1* | 1/2007 | Kishimoto | H01L 21/0475 |
| | | | 257/E21.384 |
| 2008/0099781 A1* | 5/2008 | Choi | H01L 21/0262 |
| | | | 438/494 |
| 2009/0020782 A1 | 1/2009 | Pan et al. | |
| 2009/0024933 A1 | 1/2009 | Smedley et al. | |
| 2011/0210404 A1* | 9/2011 | Su | H01L 21/823821 |
| | | | 438/296 |
| 2012/0258582 A1* | 10/2012 | Seino | H01L 29/1054 |
| | | | 257/E21.09 |
| 2015/0294867 A1* | 10/2015 | Torimi | C30B 33/02 |
| | | | 438/705 |

FOREIGN PATENT DOCUMENTS

| | | |
|---|---|---|
| KR | 100617724 B1 | 8/2006 |
| KR | 20100071693 A | 6/2010 |
| KR | 20120069127 A | 6/2012 |

OTHER PUBLICATIONS

Harle, V et al., Chlorine Assisted Selective Area Epitaxy in AP-MOVPE of InP: Influence of CCl4 on Growth and on Zn and Si Incorporation, Journal of Crystal Growth, (1992), vol. 124, pp. 260-264.

Pitts, O. J. et al., Planar Avalanche Photodiodes With Edge Breakdown Suppression Using A Novel Selective Area Growth Based Process, Journal of Crystal Growth, (2017), vol. 470, pp. 149-153.

Salehzadeh, O. et al., Edge Breakdown Suppression of Avalanche Photodiodes Using Zn Diffusion and Selective Area Growth, IEE Photonics Technology Letters, (2019), vol. 31, pp. 767-770.

Tsuchiya, T., Cl-Assisted Selective Area Growth of InP by Metalorganic Vapor Phase Epitaxy, Japanese Journal of Applied Physics, (1999) vol. 38., pp. 1034-1036.

Burm, J. et al., Edge Gain Suppression of a Planar-Type InGaAs—InP Avalanche Photodiodes with Thin Multiplication Layers for 10-GB/s Applications, IEEE Photonics Technology Letters, (2004), vol. 16, No. 7, pp. 1721-1723.

Cho, S. R. et al., Suppression of Avalanche Multiplication at the Periphery of Diffused Junction by Floating Guard Rings in a Planar InGaAs—InP Avalanche Photodiode, IEEE Photonics Technology Letters, (2000), vol. 12, No. 5, pp. 534-536.

Itzler, M. A. et al., High-Performance, Manufacturable Avalanche Photodiodes for 10 GB/s Optical Receivers, OFC 2000, (2000) Baltimore, MD, Paper FG5.

Liu, Y. et al., A Planar InP/InGaAs Avalanche Photodiode With Floating Guard Ring and Double Diffused Junction, Journal of Lightwave Technology, (1992), vol. 10, No. 2, pp. 182-193.

Wei, J. et al., Optimization of 10-GB/s Long-Wavelength Floating Guard Ring InGaAs—InP Avalanche Photodiodes, IEEE Photonics Technology Letters, (2002), vol. 14, No. 7, pp. 977-979.

International Search Report and Written Opinion for PCT/CA2019/051764.

\* cited by examiner

METHOD OF FABRICATING AN AVALANCHE PHOTODIODE EMPLOYING SINGLE DIFFUSION

RELATED APPLICATIONS

The present application is a U.S. National Stage filing under 35 U.S.C. § 371 of International Application No. PCT/CA2019/051764 filed 9 Dec. 2019, which claims priority to U.S. Provisional Application No. 62/781,721 filed 19 Dec. 2018, the contents of which are incorporated herein by reference in their entireties.

FIELD

The present disclosure relates to the field of fabricating avalanche photodiodes.

BACKGROUND

Avalanche photodiodes (APDs) are high sensitivity semiconductor optoelectronic devices that convert an optical input to electrical current. APDs are a type of photodetector that provides internal gain through avalanche multiplication. InGaAs—InP APDs with a diffused junction have been utilized in both 2.5 Gb/s and more recently, 10 Gb/s optical receivers. APDs have a mature fabrication process, high reliability, and low leakage current, making them desirable in such applications.

However, in APD, as an edge portion curvature of a pn junction is smaller than a center portion curvature thereof, the electric field of the edge portion becomes larger than that of the center portion due to a very high reverse voltage applied in order to generate an avalanche breakdown. Accordingly, when a reverse bias is applied to the p-n junction, the electric field is concentrated in the circumferential part of the diffused region, resulting in an earlier breakdown than in central part of the diffused region, which is closer to the light receiving area. This phenomenon is known as edge breakdown.

Edge breakdown is typically suppressed using known methods of a combination of a stepped diffusion profile and floating guard rings (FGRs), (as shown in U.S. Pat. No. 6,015,721 to Kim) fabricated either using a double diffusion process or by a single diffusion with wet chemical recess etching of the central junction area. Edge breakdown suppression using either of these approaches is critically dependent on the p-n junction depth offset between the central and peripheral area. This offset is challenging to control reproducibly, requiring precise calibration of two diffusions performed at separate times in the double diffusion approach, or a precisely defined etch depth using the recess etch technique. Deviations of the depth offset from the design target may introduce enhanced electric fields either at the edge of the central region, or in the guard ring area.

A need therefore exists to fabricate APDs with improved edge breakdown suppression.

The background herein is included solely to explain the context of the disclosure. This is not to be taken as an admission that any of the material referred to was published, known, or part of the common general knowledge as of the priority date.

SUMMARY

In accordance with an aspect, there is provided a method for fabricating an avalanche photodiode comprising: forming, on a substrate, a first high-doped region and a low-doped region; performing selective area growth (SAG) with in-situ etchant on the low-doped region to grow a SAG structure; and diffusing through the SAG structure to form a second high-doped region in the low-doped region.

In accordance with another aspect, there is provided a method for fabricating an avalanche photodiode comprising: forming a doped buffer layer, an absorption layer, a graded region, and a cap layer on a substrate; depositing a dielectric mask on the cap layer;
performing selective area growth (SAG) with in-situ etchant through the dielectric mask to grow a SAG structure; and performing diffusion through the selective area growth structure using the same dielectric mask to produce a diffusion junction.

In accordance with another aspect, there is provided an avalanche photodiode comprising: a substrate having a first high-doped region and a low-doped region formed thereon; selective area growth (SAG) structures grown with in-situ etchant on the low-doped region; and a second high-doped region formed by diffusing through the SAG structure into the low-doped region.

In accordance with another aspect, there is provided avalanche photodiode comprising: a substrate having a doped buffer layer, an absorption layer, a graded region, and a cap layer formed thereon; a dielectric mask deposited on the cap layer; a selective area growth (SAG) structure grown through the dielectric mask by SAG epitaxy with in-situ etchant; and a diffusion layer formed by diffusion through the selective area growth structure using the same dielectric mask.

Other features and advantages of the present invention will become apparent from the following detailed description. It should be understood, however, that the detailed description and the specific examples while indicating embodiments of the invention are given by way of illustration only, since various changes and modifications within the spirit and scope of the invention will become apparent to those skilled in the art from the detailed description.

BRIEF DESCRIPTION OF THE DRAWINGS

Embodiments will now be described, by way of example only, with reference to the accompanying drawings. The skilled person in the art will understand that the drawings, described below, are for illustration purposes only.

In the drawings, like reference numerals indicate like parts.

DETAILED DESCRIPTION

A method of edge breakdown suppression in APDs is shown in "Planar avalanche photodiodes with edge breakdown suppression using a novel selective area growth based process" by Pitts et al. (*Journal of Crystal Growth* 470 (2017) 149-153), which proposes fabricating planar avalanche photodiodes using selective area growth (SAG) followed by a single Zn diffusion through the SAG material using the same dielectric mask. The method deploys an enhanced growth rate in the vicinity of the mask edge to create a tapered surface profile of the SAG epitaxy. This tapering modifies the diffusion profile, resulting in a gradual reduction of the diffusion depth towards the outer edge of the active area. The associated reduction of the electric field counteracts the edge curvature effect sufficiently to suppress edge breakdown. This process avoids edge breakdown for devices with thick multiplication regions of about 1.1 to about 1.3 μm. However, for thinner multiplication regions suitable for high bandwidth applications, the above process resulted in premature edge breakdown at the corners of the device. A need therefore exists to fabricate APDs with suppressed edge breakdown using a single diffusion.

Figure 1:
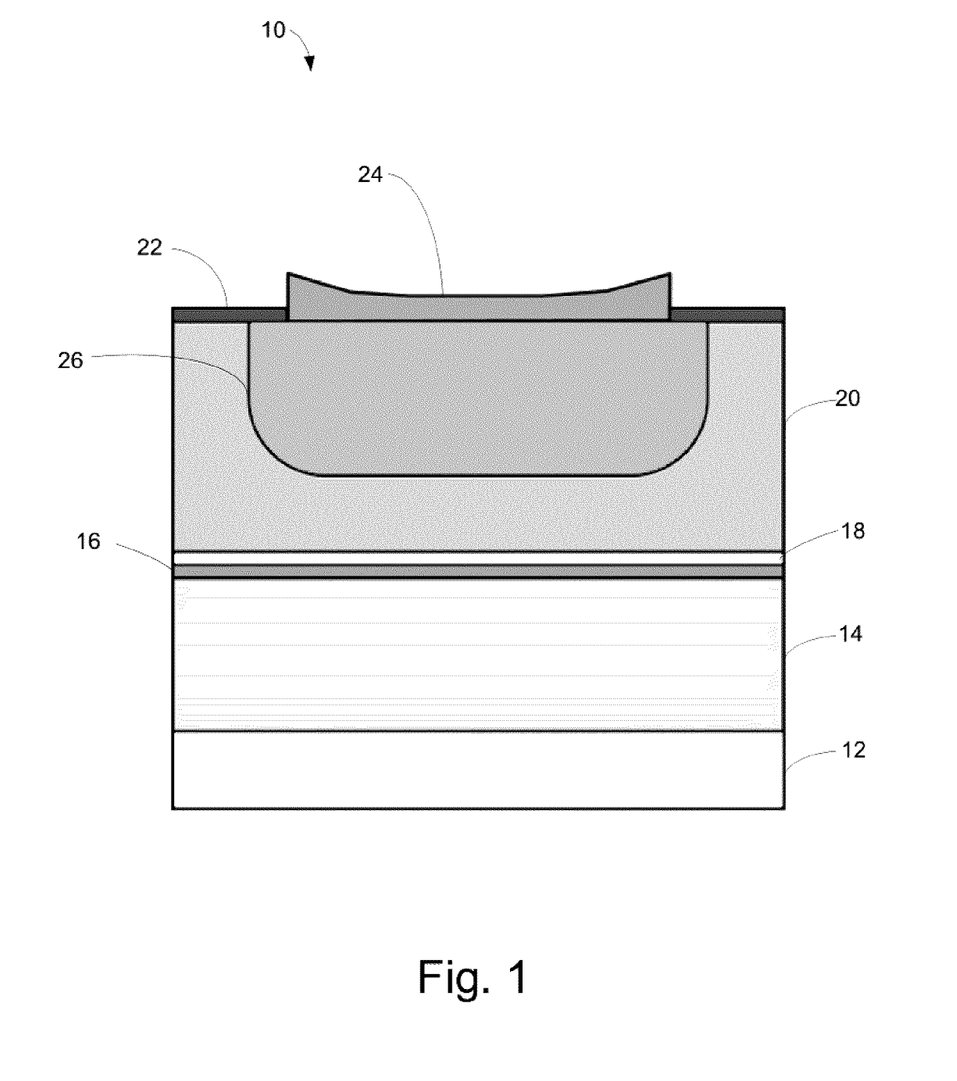
FIG. 1 shows is a schematic structure of an exemplary APD with edge breakdown suppression.
Figure 2:
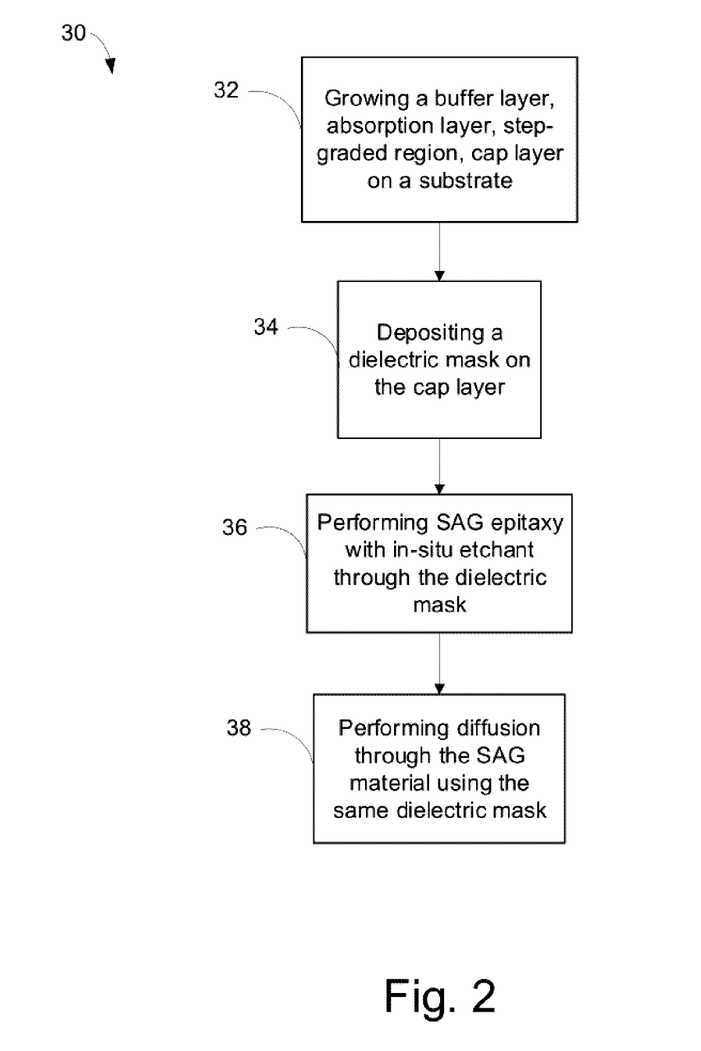
FIG. 2 shows an exemplary fabrication process to fabricate the APD of FIG. 1.

Reference is first made to FIG. 1 which shows a schematic structure of an exemplary APD 10 with edge breakdown suppression using the SAG method above FIG. 2 shows a flow diagram detailing the steps of an exemplary fabrication process 30 to fabricate the APD 10 of FIG. 1. In this example, in step 32, epiwafers are grown on a substrate 12. The epiwafers comprise a buffer layer, an absorption layer 14, a graded region 16, an optional charge sheet layer 18, and a cap layer 20. The epiwafers may be grown by metalorganic chemical vapour deposition (MOCVD).

An example of the materials that were used to fabricate the structure of FIG. 1 in experiment were a S-doped InP substrate 12, a Si-doped buffer layer, an InGaAs absorption layer 14, an INGaAsP step-graded region 16, a Si-doped InP charge sheet layer 18, and an InP cap layer 20.

An APD may be fabricated on a substrate 12 of other materials such as Si, InP, GaAs, InGaAs, Ge, GaP, GaSb, InAs, SiC, $Al_2O_3$, or GaN. Thickness of the substrate is dependent on the materials used. In the experimental case of InP, the substrate had a thickness range of about 600 to about 700 μm.

For a InP substrate 12, the absorption layer 14 is typically formed from materials such as $In_xGa_{(1-x)}As$ or $In_xGa_{(1-x)}As_yP_{(1-y)}$. For other substrates, the absorption layer may be formed from other appropriate materials. Absorption layers 14 may have a varying thickness from about 0.2 to about 3.0 μm.

The graded region 16 may be either step-graded or continuously graded. For an InP substrate 12, the graded region 16 may comprise $In_xGa_{(1-x)}As_yP_{(1-y)}$ or $In_xAl_yGa_{(1-x-y)}As$. For substrates of other materials, the graded region 16 may be formed from other appropriate materials. Graded region 16 is typically in the range of about 100 to about 200 nm thick.

Experimentally, an Si-doped InP charge sheet layer 18 was formed on the graded region 16 as shown in FIG. 1. In general, on InP substrates, the charge sheet may be InP, $In_xGa_{(1-x)}As_yP_{(1-y)}$ or $In_xAl_yGa_{(1-x-y)}As$. Dopants for an n-type charge sheet may be for example Si, S or Te. For a p-type charge sheet Zn, Be or C may be used for example.

For an InP substrate 12, the cap layer 20 may be formed from materials such as InP, $In_xGa_{(1-x)}As_yP_{(1-y)}$ or $In_xAl_yGa_{(1-x-y)}As$ and have thickness of the range of about 2 to about 4 nm. For other substrates, the cap layer may be formed from other appropriate materials and have a different range of thicknesses depending on the material used.

In step 34, a single dielectric mask 22 is deposited. The dielectric mask 22 may be used for both the SAG process and the subsequent diffusion. The mask may be fabricated from PECVD-deposited silicon nitride patterned by standard photolithography. The mask may be fabricated to include devices both with and without floating guard rings (FGRs).

Experimentally, the SAG epitaxy 24 was performed by MOCVD (step 36) at a growth temperature of about 580° C. MOCVD may be performed at a temperature range of about 550° C. to about 600° C. In the experiment, SAG epitaxial structures 24 comprised undoped InP, Si-doped InP, Si-doped combination of InP/InGaAs with thicknesses between about 100 nm and about 200 nm. The SAG material is typically chosen to lattice-match to the substrate. As examples, for APD structures grown on InP substrates typical SAG materials would be InP, $In_xGa_{(1-x)}As$, $In_xGa_{(1-x)}As_yP_{(1-y)}$, or multilayer heterostructures of these materials. For other substrates such as GaAs or Si, typically the same material as the substrate is chosen, but other materials may also be possible.

The thicknesses are given as the unenhanced or planar growth values. In one embodiment, the SAG process includes using an in-situ etchant to reduce the growth rate and modify the growth morphology, producing a smoother morphology and therefore reduces edge breakdown near the corners of the device. As used herein, the term "in-situ" refers to a process step or process steps within the growth chamber of a MOCVD device. The in-situ etchant is introduced in the same way as the growth precursors in a CVD process (of which MOCVD is a particular variant). For etchants that are liquid at room temperature (e.g. $CBrCl_3$), it is first evaporated by bubbling a carrier gas through the etchant container (bubbler), then carried in the vapor phase into the reactor chamber. Some other possible etchants (e.g. $CCl_4$) would be stored as compressed gases and introduced into the growth apparatus in the gas phase. The in-situ etchants that may be used may include but are not limited to $CBrCl_3$, $CBr_4$, $CCl_3$, $C_2H_5I$, HCl, $C_2H_5Cl$, $PCl_3$, $AsCl_3$, $C_3H_7Cl$, and $CH_2Cl_2$. In experiments using the in-situ etchant, the SAG epitaxial structures had thicknesses of the range of about 150 nm to about 250 nm when measured far from the masking material. In general, a target for the SAG epitaxial structures is about 200 to about 400 nm between the center and edge of the device diffusion window, where the height difference may depend on the SAG layer thickness as well as the mask geometry and growth conditions.

The diffusion process is performed in step 38 to form the diffusion junction 26. In an experimental example, the diffusion process was performed in the same MOCVD reactor, in a separate process step, at about 530° C. using DMZn as the Zn source with an overpressure of PH3 to prevent desorption of phosphorus from the InP surface. In general, the diffusion process in the MOCVD may be performed at a temperature range of about 475° C. to 550° C. The diffusion process conditions are typically chosen to produce devices with low dark current and to prevent solid $Zn_3P_2$ deposits on the surface. After diffusion, a rapid thermal anneal (RTA) treatment in a N2 ambient may be used in order to ensure electrical activation of the Zn dopant. Pd/Zn/Pd/Au ohmic p-metal contacts and Ti/Pt/Au interconnects/bond pads may then be deposited on the diffused area. Such diffusion into the SAG epitaxy 24 results in a gradually raised diffusion profile approaching the device edge.

While FIG. 1 shows one example of an applicable APD structure 10, the utilization of in-situ etchant during SAG epitaxy may be applicable to any device with the following restrictions: (1) that the APD structure be arranged such that the multiplication region is in a relatively low-doped region, in between two higher doped regions of opposite type, so that the junction depletion width in reverse bias is effectively controlled by the thickness of the low doped region; and (2)

that at least one of the higher doped regions is formed by a diffusion process. For example, the method may be applied to other APD structures and materials where the diode junction is formed by diffusion. For example, the method may be applied to homojunction APDs made using a single semiconductor material such as Si, Ge, or GaAs The method may also be applied to other heterostructure APD designs and materials. For example, another variation is the separate absorption, grading, and multiplication (SAGM) structure which does not contain a charge sheet layer. Other variations may include structures known as separate absorption and multiplication (SAM) and separate absorption, charge and multiplication (SACM). Other possible materials systems may include but are not limited to, for example, InP/InGaAsP, GaAs/AlGaAs, InGaAs/AlGaAsSb, ZnMgSSe/ZnSe, InAlGaAs/InGaAs/InP, or AlGaN/GaN.

In another example, an APD comprising of a single material (e.g. Si, Ge, GaAs) may not include any discrete layers such as those in the exemplary APD structure 10 of FIG. 1. For example, the doping profile may be obtained by a combination of implantation and diffusion processes into a bulk grown substrate. The doping profile may be alternatively obtained by epitaxial growth and diffusion, in which case, the single-material APD structure may contain a buffer layer but not separate absorption, grade, and charge sheet layers. Historically, heterostructure APD designs containing different materials were first developed where it was desirable for the absorption to occur in a lower band gap layer than the multiplication (separate absorption and multiplication or SAM structure). Subsequently, a grading layer was added to reduce carrier trapping at the interface between the absorption and multiplication regions (SAGM). Lastly, the doping was concentrated into a charge sheet layer to obtain better control/reproducibility of the multiplication width (SAGCM structure, such as the one we have studied). Designs with a charge sheet but no grading layer (SACM) may also utilize this method.

While specific dopant species and doping types were described above (Si, S, Zn), the method is not limited to these particular dopants or doping types. For example, the junction may be inverted with respect to the one described in FIG. 1 so that the diffusion is of an n-type dopant into a p-type layer or layer structure.

FIGS. 3A-F show the photocurrent profile maps of three exemplary SAG structures with and without in-situ etchant. The APDs in these photocurrent profile maps have a radius of 60 μm. In these examples, the photocurrent maps were obtained by raster scanning a 1550 nm optical beam focused by a lensed optical fiber to a spot size of about 2 microns. The bias voltage was set to obtain about 1 μA dark current in the absence of an optical beam.

Figure 3A:
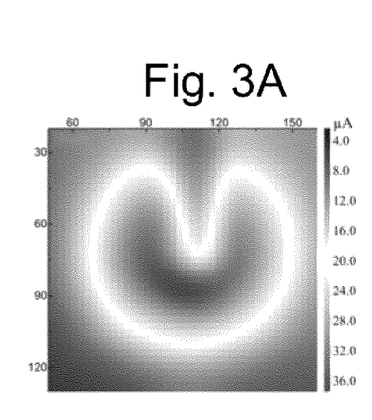
FIGS. 3A to 3F show photocurrent profiles for an exemplary APD devices with targeted SAG with and without in-situ etchant.
Figure 3B:
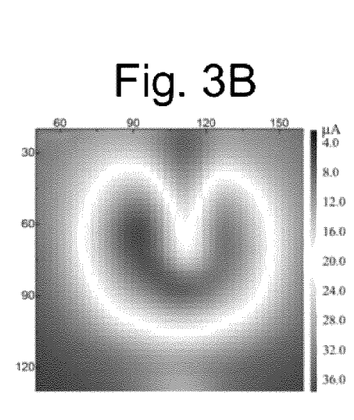
Figure 3C:
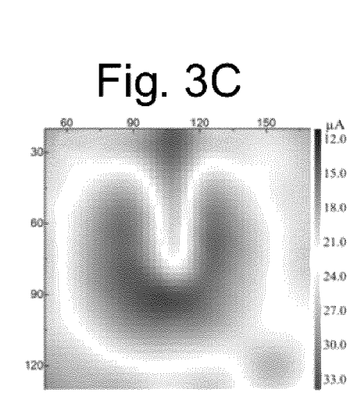
Figure 3D:
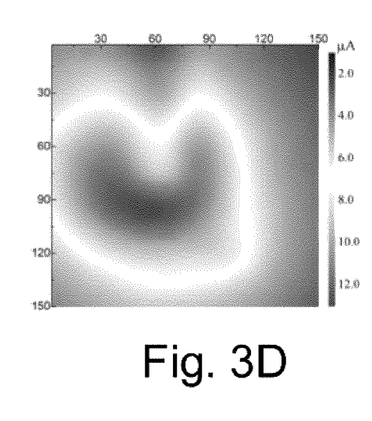
Figure 3E:
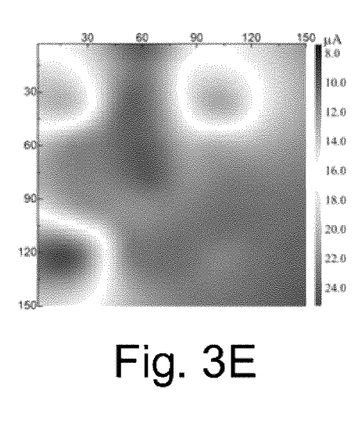
Figure 3F:
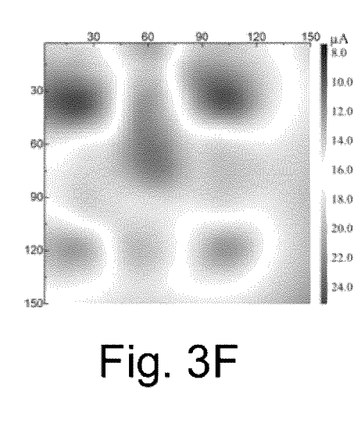

FIG. 3A depicts the photocurrent profile for an SAG structure with no FGRs using in-situ etchant. FIG. 3B shows the photocurrent profile for an SAG structure with one FGR using in-situ etchant. FIG. 3C shows the photocurrent profile for an SAG structure with two floating guard rings using in-situ etchant. FIG. 3D shows the photocurrent profile for an SAG structure with no FGR without in-situ etchant. FIG. 3E shows the photocurrent profile for an SAG structure with one FGR without in-situ etchant. FIG. 3F shows the photocurrent profile for an SAG structure with two FGRs without in-situ etchant. Because the optical absorption does not vary with position, the spatially dependent photocurrent provides an indication of the distribution of multiplication gain, which is dependent on the local electric field strength. Areas of enhanced photocurrent response outside the central circular active area are an indication of undesirable edge breakdown, particularly where such edge response is stronger than that in the central region (for example, in FIGS. 3E and 3F). The roughly U-shaped area of lower response extending from the top of the images to the center (for example, in FIGS. 3A to 3D) is due to blockage of the optical beam by the metal interconnect on top of the device and does not indicate lower electric field in those areas.

Figure 4A:
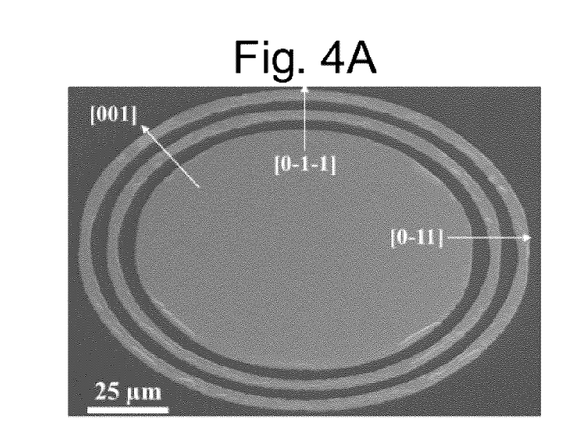
FIGS. 4A to 4D show images of an exemplary APD with targeted SAG with and without in-situ etchant taken with a scanning electron microscope.
Figure 4B:
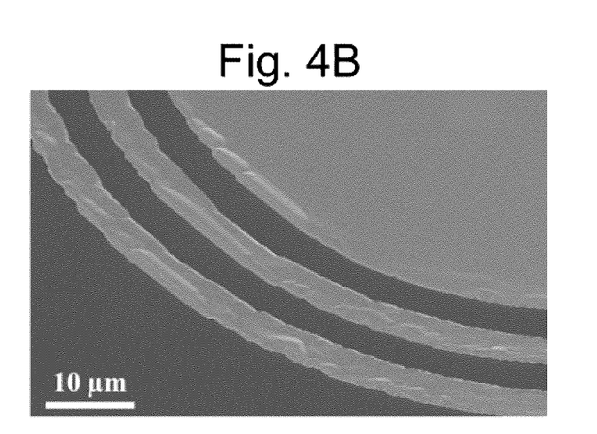
Figure 4C:
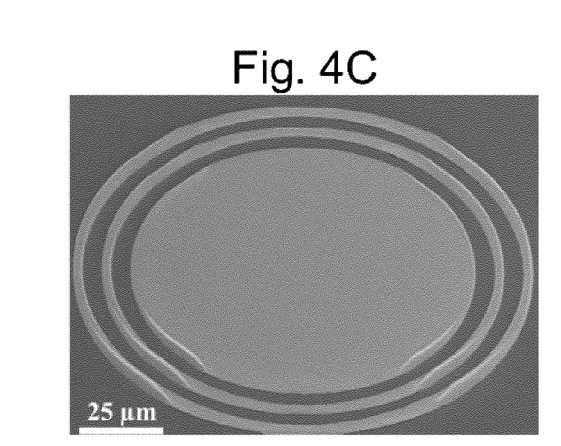
Figure 4D:
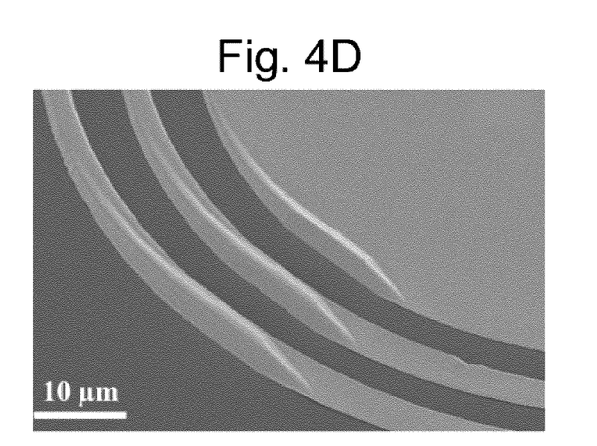

FIGS. 4A to 4D show images of an APD taken with a scanning electron microscope. FIGS. 4A and 4B show the growth morphology resulting without the in-situ etchant at about 25 μm resolution and about 10 μm resolution, respectively. FIGS. 4C and 4D show the growth morphology resulting using the in-situ etchant at about 25 μm resolution and about 10 μm resolution, respectively. As shown, the use of in-situ etchant produces a smoother morphology, especially FIG. 4B versus FIG. 4D. In this example, the in-situ etchant was $CBrCl_3$.

In some embodiments, the above method is mostly compatible with standard APD fabrication processes and may be applied to typical commercial planar APD designs with minor modifications to the mask geometry. Typical mask geometry constraints are if: (1) the masked area surrounding the active area is sufficient to produce the required growth enhancement; (2) limited design variations can be accommodated on the same wafer because the SAG enhancement, and as a result the multiplication width will vary with mask geometry (especially with regard to different active area sizes). Therefore, any design variations may have to be separated onto different wafers or batches.

In understanding the scope of the present application, the articles "a", "an", "the", and "said" are intended to mean that there are one or more of the elements, unless specifically stated otherwise. The use of "or" means "and/or", unless specifically stated otherwise. Additionally, the term "comprising" and its derivatives, as used herein, are intended to be open ended terms that specify the presence of the stated features, elements, cores, groups, integers, and/or steps, but do not exclude the presence of other unstated features, elements, cores, groups, integers and/or steps. The foregoing also applies to words having similar meanings such as the terms, "including", "having" and their derivatives.

It will be understood that any aspects described as "comprising" may also "consist of" or "consist essentially of," wherein "consisting of" has a closed-ended or restrictive meaning and "consisting essentially of" means including the components or steps specified but excluding other components or steps except for materials present as impurities, unavoidable materials present as a result of processes, and components added for a purpose other than achieving the technical effect of the invention.

In certain embodiments, the "x" and "y" values may be any suitable value. Examples include ($0<x<1$, $0<y<1$, $x<y$), $x=0.4526/(1-0.031y)$ or x is about 0.45.

It will be understood that any feature defined herein as being included may be explicitly excluded from the claimed invention by way of proviso or negative limitation.

In addition, all ranges given herein include the end of the ranges and also any intermediate range points, whether explicitly stated or not.

Finally, terms of degree such as "substantially", "about", "significantly" and "approximately" as used herein mean a reasonable amount of deviation of the modified term such that the end result is not majorly changed. These terms of degree should be construed as including a deviation of ±5% of the modified term if this deviation would not negate the meaning of the word it modifies.

It is to be understood that the foregoing is exemplary and explanatory only, and it is to be understood that such detail is solely for that purpose and that the invention is not limited to the disclosed embodiments, but, on the contrary, is intended to cover modifications and equivalent arrangements that are within the spirit and scope of the appended claims. As an example, it is to be understood that the present invention contemplates that, to the extent possible, one or more features of any embodiment can be combined with one or more features of any other embodiment.

What is claimed is:

1. A method for fabricating an avalanche photodiode comprising:
   forming, on a substrate, a first high-doped region and a low-doped region;
   performing selective area growth (SAG), simultaneously, with in-situ etchant on the low-doped region to grow a SAG structure; and
   diffusing through the SAG structure to form a second high-doped region in the low-doped region.

2. The method of claim 1, wherein the in-situ etchant is selected from $CBrCl_3$, $CBr_4$, $CCl_4$, $C_2H_5I$, HCl, $C_2H_5Cl$, PCl3, $AsCl_3$, $C_3H_7Cl$, or $CH_2Cl_2$;
   wherein the SAG epitaxy is performed in an MOCVD reactor at a growth temperature range of about 550° C. to about 600° C.;
   wherein the SAG is performed to grow SAG structures using materials that match a lattice of the substrate;
   wherein the SAG structure has a thickness of about 150 nm to about 250 nm; and/or
   wherein the substrate is selected from Si, InP, GaAs, Ge, GaP, GaSb, InAs, SiC, $Al_2O_2$, GaN, or InGaAs.

3. The method of claim 2, wherein when the substrate is InP, the materials used to perform SAG are selected from InP, $In_xGa_{(1-x)}As$, or $In_xGa_{(1-x)}As_yP_{(1-y)}$;
   wherein when the substrate is Si, the material used to perform SAG is Si; or
   wherein when the substrate is GaAs, the material used to perform SAG is GaAs.

4. The method of claim 1, further comprising:
   i) forming an absorption layer on the substrate;
   ii) forming an absorption layer on the substrate, wherein the substrate is InP and the absorption layer is formed from $In_xGa_{(1-x)}As$ or $In_xGa_{(1-x)}As_yP_{(1-y)}$; or
   iii) forming an absorption layer on the substrate, wherein the substrate is InP and the absorption layer is formed from $In_xGa_{(1-x)}As$ or $In_xGa_{(1-x)}As_yP_{(1-y)}$ and has a thickness of about 0.2 µm to about 3.0 µm.

5. The method of claim 1, further comprising:
   i) forming a graded region on the substrate;
   ii) forming a graded region on the substrate, wherein the substrate is InP and the graded region is formed from $In_xGa_{(1-x)}As_yP_{(1-y)}$ or $In_xAl_yGa_{(1-x-y)}As$; or
   iii) forming a graded region on the substrate, wherein the substrate is InP and the graded region is formed from $In_xGa_{(1-x)}As_yP_{(1-y)}$ or $In_xAl_yGa_{(1-x-y)}As$ and has a thickness of about 100 to about 200 nm.

6. The method of claim 1, further comprising:
   i) forming a cap layer on the substrate;
   ii) forming a cap layer on the substrate, wherein the substrate is InP and the cap layer is formed from materials selected from InP, $In_xGa_{(1-x)}As_yP_{(1-y)}$, or $In_xAl_yGa_{(1-x-y)}As$; or
   iii) forming a cap layer on the substrate, wherein the substrate is InP and the cap layer is formed from materials selected from InP, $In_xGa_{(1-x)}As_yP_{(1-y)}$, or $In_xAl_yGa_{(1-x-y)}As$ and has a thickness of about 2 µm to about 4 µm.

7. The method of claim 1, wherein the diffusion is performed in the MOCVD reactor at a temperature range of about 475° C. to about 550° C.

8. The method of claim 1 further comprising:
   i) forming a charge sheet layer between a graded region and a cap layer on the substrate;
   ii) forming a charge sheet layer between a graded region and a cap layer on the substrate and when the substrate is InP, the charge sheet layer is formed using materials selected from InP, $In_xGa_{(1-x)}As_yP_{(1-y)}$ or $In_xAl_yGa_{(1-x-y)}As$;
   iii) forming a charge sheet layer between a graded region and a cap layer on the substrate, the charge sheet layer being doped by a dopant to be an n-type charge sheet, wherein the dopant is selected from Si, S, or Te; or
   iv) forming a charge sheet layer between a graded region and a cap layer on the substrate, the charge sheet layer being doped by a dopant to be a p-type charge sheet, wherein the dopant is selected from Zn, Be, or C.

9. The method of claim 8 further comprising annealing the avalanche photodiode and/or
   further comprising depositing a dielectric mask deposited on the cap layer prior to the performing selective area growth (SAG) with in-situ etchant.

10. An avalanche photodiode comprising:
    a substrate having a first high-doped region and a low-doped region formed thereon;
    selective area growth (SAG) structures grown, simultaneously, with in-situ etchant on the low-doped region; and
    a second high-doped region formed by diffusing through the SAG structure into the low-doped region.

11. The avalanche photodiode of claim 10, wherein the in-situ etchant is selected from the group $CBrCl_3$, $CBr_4$, $CCl_4$, $C_2H_5I$, HCl, $C_2H_5Cl$, $PCl_3$, $AsCl_3$, $C_3H_7Cl$, or $CH_2Cl_2$.

12. The avalanche photodiode of claim 10, wherein the SAG is performed to grow SAG structures using materials that match a lattice of the substrate;
    wherein the SAG structure has a thickness of about 150 nm to about 260 nm;
    wherein the SAG epitaxy is performed in an MOCVD reactor at a growth temperature range of about 550° C. to about 600° C.; and/or
    wherein the substrate is selected from Si, InP, GaAs, Ge, GaP, GaSb, InAs, SiC, $Al_2O_3$, GaN, or InGaAs.

13. The avalanche photodiode of claim 11, wherein the SAG is performed to grow SAG structures using materials that match a lattice of the substrate;
    wherein the SAG structure has a thickness of about 150 nm to about 260 nm;
    wherein the SAG epitaxy is performed in an MOCVD reactor at a growth temperature range of about 550° C. to about 600° C.; and/or
    wherein the substrate is selected from Si, InP, GaAs, Ge, GaP, GaSb, InAs, SiC, $Al_2O_3$, GaN, or InGaAs.

14. The avalanche photodiode of claim 10, wherein when the substrate is InP, the materials used to perform SAG are selected from InP, $In_xGa_{(1-x)}As$, or $In_xGa_{(1-x)}As_yP_{(1-y)}$;
    wherein when the substrate is Si, the material used to perform SAG is Si; or wherein when the substrate is GaAs, the material used to perform SAG is GaAs.

15. The avalanche photodiode of claim 10, wherein:
i) the substrate has an absorption layer;
ii) the substrate has an absorption layer, wherein the substrate is InP and the absorption layer is formed from $In_xGa_{(1-x)}As$ or $In_xGa_{(1-x)}As_yP_{(1-y)}$;
iii) the substrate has an absorption layer, wherein the substrate is InP, the absorption layer is formed from $In_xGa_{(1-x)}As$ or $In_xGa_{(1-x)}As_yP_{(1-y)}$ and has a thickness of about 0.2 μm to 3.0 μm.

16. The avalanche photodiode of claim 10, wherein:
i) the substrate has a graded region;
ii) the substrate has a graded region, wherein the substrate is InP and the graded region is $In_xGa_{(1-x)}As_yP_{(1-y)}$ or $In_xAl_yGa_{(1-x-y)}As$; or
iii) the substrate has a graded region, wherein the graded region is $In_xGa_{(1-x)}As_yP_{(1-y)}$ or $In_xAl_yGa_{(1-x-y)}As$ and has a thickness of about 100 to about 200 nm;
and/or
iv) the substrate has a cap layer;
v) the substrate has a cap layer, wherein the substrate is InP, the cap layer is formed from materials selected from InP, $In_xGa_{(1-x)}As_yP_{(1-y)}$, or $In_xAl_yGa_{(1-x-y)}As$; or
vi) the substrate has a cap layer, wherein the substrate is InP, the cap layer is formed from materials selected from InP, $In_xGa_{(1-x)}As_yP_{(1-y)}$, or $In_xAl_yGa_{(1-x-y)}As$ and has a thickness of about 2 μm to about 4 μm.

17. The avalanche photodiode of claim 10, wherein:
i) the substrate has a doped buffer layer, an absorption layer, a graded region, and a cap layer formed thereon;
ii) the substrate has a doped buffer layer, an absorption layer, a graded region, and a cap layer formed thereon, the substrate further comprising a charge sheet layer between the graded region and the cap layer;
iii) the substrate has a doped buffer layer, an absorption layer, a graded region, and a cap layer formed thereon, the substrate further comprising a charge sheet layer between the graded region and the cap layer, wherein the substrate is InP, the charge sheet layer is formed using materials selected from InP, $In_xGa_{(1-x)}As_yP_{(1-y)}$, or $In_xAl_yGa_{(1-x-y)}As$; or
iv) the substrate has a doped buffer layer, an absorption layer, a graded region, and a cap layer formed thereon, the substrate further comprising a charge sheet layer between the graded region and the cap layer, wherein the substrate is InP, the charge sheet layer is formed using materials selected from InP, $In_xGa_{(1-x)}As_yP_{(1-y)}$, or $In_xAl_yGa_{(1-x-y)}As$ the charge sheet layer being doped by a dopant to be an n-type charge sheet, wherein the dopant is selected from Si, S, or Te or the charge sheet layer is doped by a dopant to be a p-type charge sheet, wherein the dopant is selected from Zn, Be, or C.

18. The avalanche photodiode of claim 10, wherein the avalanche photodiode is an annealed avalanche photodiode.

19. The avalanche photodiode of claim 17 further comprising a dielectric mask deposited on the cap layer.

\* \* \* \* \*